US006444373B1

(12) United States Patent
Subramanian et al.

(10) Patent No.: US 6,444,373 B1
(45) Date of Patent: Sep. 3, 2002

(54) MODIFICATION OF MASK LAYOUT DATA TO IMPROVE MASK FIDELITY

(75) Inventors: Ramkumar Subramanian; Khoi A. Phan, both of San Jose; Bhanwar Singh, Morgan Hills; Bharath Rangarajan, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 109 days.

(21) Appl. No.: 09/596,954

(22) Filed: Jun. 16, 2000

(51) Int. Cl.$^7$ ................................................. G03F 9/00
(52) U.S. Cl. ........................................................ 430/5
(58) Field of Search ........................... 430/5; 250/492.2, 250/492.22, 492.3

(56) References Cited

U.S. PATENT DOCUMENTS

| | | | |
|---|---|---|---|
| 5,600,734 A | * 2/1997 | Okubo et al. | 382/147 |
| 5,723,233 A | 3/1998 | Garza et al. | 430/5 |
| 5,740,068 A | 4/1998 | Liebmann et al. | 364/489 |
| 5,792,581 A | * 8/1998 | Ohnuma | |
| 5,821,014 A | 10/1998 | Chen et al. | 430/5 |
| 5,858,591 A | 1/1999 | Lin et al. | 430/30 |
| 5,885,747 A | * 3/1999 | Yamasaki et al. | |
| 5,991,006 A | * 11/1999 | Tsudaka | 430/5 |
| 6,330,708 B1 | * 12/2001 | Parker et al. | 716/19 |

OTHER PUBLICATIONS

"Optical Proximity Correction : Mask Pattern–Generation Challenges", Microelectronic Engineering, R. Jonckheere, A. Wong, A. Yen, K. Ronse and L. Van Den Hove, vol. 30, No. 1, 1996, pp. 115–118.

"Application of Image Processing Software to Characterize the Photomask Key Parameters for Future Technologies", Photomask and X–Ray Mask Technology IV, Kawasaki, Japan, Apr. 17–18, 1997, A. Tran, M. Schmidt, J. Farnsworth and Pei–Yang Yan, SPIE, vol. 3096, pp. 423–432.

"Integrating Proximity Effects Corrections with Photomask Data Preparation", Oberdan W. Otto and Richard C. Henderson, SPIE Optical/Laser Microlithography, Feb. 22–24, 1995, vol. 2440, pp. 184–191.

International Search Report, International Application No. PCT/US01/12853, International Filing Date Apr. 19, 2001, date of mailing May 2, 2002, 4 pages.

* cited by examiner

Primary Examiner—S. Rosasco
(74) Attorney, Agent, or Firm—Eschweiler & Associates, LLC

(57) ABSTRACT

The present invention relates to a system and method of modifying mask layout data to improve the fidelity of mask manufacture. The system and method include determining the difference between the mask layout design and the mask features as written, and generating sizing corrections. The sizing corrections can be used to modify the mask layout data, and/or stored in a database.

15 Claims, 16 Drawing Sheets

FIG. 1
FIG. 2
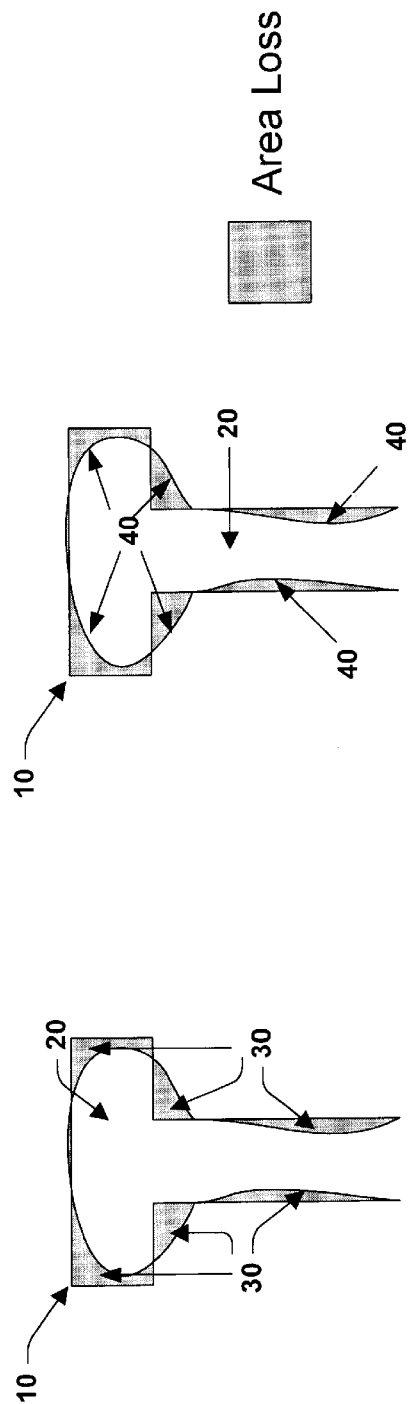
FIG. 3
FIG. 4
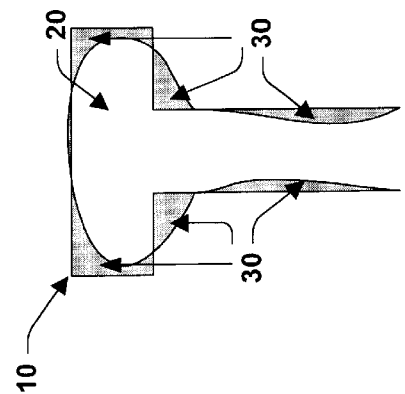
Area Loss

US 6,444,373 B1

MODIFICATION OF MASK LAYOUT DATA TO IMPROVE MASK FIDELITY

FIELD OF THE INVENTION

The present invention generally relates to semiconductor processing, and more particularly relates to a system and a method for modifying the mask layout data used to generate photomasks.

BACKGROUND OF THE INVENTION

The manufacturing of semiconductor devices is dependent upon the accurate replication of device design data onto the surface of a semiconductor substrate. The minimum feature sizes of integrated circuits are continuously decreasing in order to increase the packing density of the various semiconductor devices formed thereby. With this size reduction, however, various steps within the integrated circuit fabrication process become more difficult. Photolithography, the manufacture of photomasks (reticles), and optical proximity correction (OPC) are areas that experience unique challenges as feature sizes shrink.

Photolithography involves selectively exposing regions of a resist-coated silicon wafer to form a radiation pattern. Once exposure is complete, the exposed resist is developed in order to selectively expose and protect the various regions on the silicon wafer defined by the exposure pattern (e.g, silicon regions in the substrate, polysilicon on the substrate, or insulating layers such as silicon dioxide).

An integral component of a photolithography system is a reticle (often called a mask or photomask) which includes a pattern thereon corresponding to features to be formed in a layer on the substrate. A reticle typically includes a transparent glass plate covered with a patterned light blocking material such as chrome. The reticle is placed between a radiation source producing radiation of a pre-selected wavelength (e.g., ultraviolet light) and a focusing lens which may form part of a stepper apparatus. Placed beneath the stepper is a resist-covered silicon wafer. When the radiation from the radiation source is directed onto the reticle, light passes through the glass (in the regions not containing the chrome patterns) and projects onto the resist-covered silicon wafer. In this manner, an image of the reticle is transferred to the resist.

The mask layout data, or mask layout, is a digital representation of a desired integrated circuit pattern. This digital representation is used by the reticle manufacturer to generate the reticle. Typically, the mask layout data is generated using computer aided design (CAD) techniques. The pattern features correspond to the features of the integrated circuit devices that are to be fabricated. The quality of the mask patterns on the mask are critical to generating the desired integrated circuit features on the wafer. Critical dimensions include the size of patterns across the mask, such as line width and spacing.

A mask is a optically clear quartz substrate with a chrome pattern. To generate a mask, a layer of photoresist is applied to a chrome coated reticle blank.

The resist (sometimes referred to as the "photoresist") is provided as a thin layer of radiation-sensitive material. The mask layout design is transferred to the reticle using a mask writer, or mask writer system, for instance, a laser writer or an electron beam (e-beam) writer. A laser writer transfers the mask layout data to the reticle by selectively exposing areas of the photoresist to ultra-violet (UV) light. An e-beam pattern transfers the mask layout data to the reticle by selectively exposing areas of the photoresist to an electron beam. After pattern generation, the exposed photoresist is removed with a chemical solution, and the exposed areas of chrome are etched away leaving a quartz surface. The remaining photoresist is then removed, and the finished mask has the mask layout data pattern on its surface.

To transfer the reticle pattern to a semiconductor substrate, a thin-layer of resist is spin-coated over the entire silicon wafer surface. The resist material is classified as either positive or negative depending on how it responds to the light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle.

As UV light passes through the reticle to develop the resist, it is diffracted and scattered by the edges of the chrome. This causes the projected image to exhibit some rounding and other optical distortion. While such effects pose relatively little difficulty in layouts with large features (e.g., features with critical dimensions greater than one micron), they can not be ignored in present day layouts where critical dimensions are about 0.25 micron or smaller. The problem highlighted above becomes more pronounced in integrated circuit designs having feature sizes below the wavelength of the radiation used in the photolithographic process.

To remedy this problem, a reticle correction technique known as optical proximity correction (OPC) has been developed. OPC involves the adding of dark regions to and/or the subtracting of dark regions from portions of a reticle to overcome the distorting effects of diffraction and scattering when transferring the mask patterns to the substrate. Typically, OPC is performed on the mask layout data. First, the mask layout data is evaluated with software to identify regions where optical distortion will result. Then the OPC features are added to the mask layout data to compensate for the distortion. The mask layout data with the OPC features added is referred to as the optical proximity corrected mask layout data, or optical proximity corrected mask layout. The resulting pattern of the optical proximity corrected mask layout is ultimately transferred to the reticle glass. Some optical proximity correction takes the form of "serifs." Serifs are small, appendage-type addition or subtraction regions typically made at corner regions on reticle designs. As used in the present invention, the term serif is used to identify both addition and subtraction regions.

FIG. 1 shows a mask design layout feature 10. Unfortunately, as shown in FIG. 2, the mask feature 20 as written by the mask writer can deviate from the layout feature 10, for instance, right angles will exhibit rounding. Right angles are desirable features of semiconductor devices, and OPC correction features, such as serifs. For instance, the intersection of a transistor and a gate line often forms a T-shaped feature, and a serif often is square in shape. The shape of the device features and the OPC, such as serifs, must be accurately reproduced onto the mask to accurately pattern the semiconductor substrate. Rounding of these features interferes with optical proximity correction, negatively impacts device performance, and adds a level of nonuniformity between transistors which is undesirable. For instance, a rounded serif will not yield optimal optical proximity correction. Similarly, a mask with rounding of the T-shaped device features will not produce right angles on the semiconductor, and this will impact the transistor performance and the device packing density.

Since rounding is highly undesirable and results in degraded transistor performance, increased transistor layout spacing (which decreases device packing density), and interference with optical proximity correction, there is an unmet need for a system and method to reduce corner rounding. This need is especially felt in OPC, where the OPC features necessary to correct for optical distortion are often of small dimension with sharp angles and other difficult to write features. A system and method for improving the writeability of OPC features onto the reticle is needed.

SUMMARY OF THE INVENTION

The present invention generally relates to a system and a method for improving the manufacture of masks used in manufacturing integrated circuits. Mask features and portions of mask features can be very small, such as an optical proximity correction (OPC) feature, including serifs. Since small features are difficult to write onto the mask accurately, the mask layout data may not be reproduced on the mask with fidelity. In the present invention, a mask is produced from a mask design layout. The difference between the layout features and the mask features as written is termed the area loss. The area loss is determined by using edge detection techniques, such as by inspection with a scanning electron microscope. The area loss information is fed into a computer system, which generates sizing corrections to adjust the mask writer.

In one aspect of the invention, the mask design layout data is modified by the sizing corrections, and a corrected mask is produced using the corrected mask design layout data. The resulting features on the corrected mask more accurately represent the design layout features. In another aspect of the invention, a database of sizing corrections for various feature types and sizes can be generated and stored. A mask design layout is modified by the sizing corrections, and when the mask is written, the resulting mask exhibits greater fidelity.

Another aspect of the present invention relates to a method of improving the manufacture of a mask. The method includes providing a mask layout, and writing a mask from the mask layout. The mask layout includes a mask layout feature, and the mask includes a mask feature corresponding to the mask layout feature. Then one or more area loss data comprise substantially a difference between a portion of the mask feature and a corresponding portion of the mask layout feature are determined. The mask layout is modified in response to the determined one or more area loss data. A corrected mask may be written from the modified mask layout.

The one or more area loss data may be determined by an edge detection technique. The edge detection technique may include detecting one or more edge features of the portion of the mask feature with a scanning electron microscope. The method may further include generating one or more edge data from the one or more edge features, such as one or more radii of the portion of the mask feature. The one or more edge data may be input into a processor, and the processor may calculate the one or more area loss data by comparing the one or more edge data to the corresponding portion of the mask layout feature. The portion of the mask layout feature may be an optical proximity correction feature. The mask layout may be modified by determining one or more sizing correction data from the area loss data, and a database of one or more sizing correction data may be generated. The one or more sizing correction data may be determined by inputting the one or more area loss data into a processor that calculates the one or more sizing correction data. The present invention may be used to modify any type of mask layout, such as an optical proximity corrected mask layout. The mask layout may include a plurality of mask layout features and the mask may include a plurality of mask features corresponding to the plurality of mask layout features.

Yet another aspect of the present invention relates to a method of improving the manufacture of a mask. The method includes providing a mask layout, and writing a mask from the mask layout. The mask layout includes a mask layout feature, and the mask includes a mask feature corresponding to the mask layout feature. An area loss is determined, which comprises substantially a difference between a portion of the mask feature and a corresponding portion of the mask layout feature. Then one or more sizing corrections are generated from the area loss, and the one or more sizing corrections are stored in a database. The mask layout may be modified in accordance with the one or more sizing corrections stored in the database, and a corrected mask may be written from the modified mask layout.

The area loss may be determined by an edge detection technique. The edge detection technique may include detecting one or more edges of the portion of the mask feature with a scanning electron microscope. The method may further include determining one or more edge data by the edge detection technique, such as one or more radii of the portion of the mask feature. The one or more edge data may be input into a processor that calculates the area loss. The portion of the mask feature may be an optical proximity correction feature. The one or more sizing corrections may be determined by inputting the area loss into a processor that calculates the one or more sizing correction data. The present invention may be used to modify any type of mask layout, such as an optical proximity corrected mask layout. The mask layout may include a plurality of mask layout features and the mask may include a plurality of mask features corresponding to the plurality of mask layout features.

Another aspect of the present invention relates to a system for manufacturing a mask. The system includes an edge detector, a processor, and a mask writer operatively coupled to the processor. The edge detector determines one or more edge data of a portion of a mask feature. The processor receives the one or more edge data and is operatively coupled to an algorithm that calculates one or more area loss data from the one or more edge data. The mask writer receives the one or more area loss data. The mask writer may include an algorithm for determining one or more sizing correction data from the one or more area loss data. The system may further include a database operatively coupled to the mask writer to store the one or more sizing correction data. The edge detector may be a scanning electron microscope. The mask writer can include an algorithm for modifying a mask layout in accordance with the one or more sizing correction data. The system may be used to calculate area loss data on any portion of the mask feature, such as an optical proximity correction feature. The system may be used to modify any type of mask layout, such as an optical proximity corrected mask layout. The mask layout may include a plurality of mask layout features and the mask may include a plurality of mask features corresponding to the plurality of mask layout features.

Still yet another aspect of the present invention relates to a system for manufacturing a mask. The system includes an edge detector, a processor, and a mask writer operatively coupled to the processor. The edge detector determines one or more edge data. The processor receives the one or more edge data and is operatively coupled to one or more algorithms that determine one or more sizing correction data from the one or more edge data. The mask writer receives the one or more sizing correction data. The mask writer may further include at least one algorithm for modifying a mask layout in accordance with the one or more sizing correction data.

The system can further include a database operatively coupled to the mask writer to store the one or more sizing correction data. The edge detector may be a scanning electron microscope. The system may be used to modify any type of mask layout, such as an optical proximity corrected mask layout. The mask layout may include a plurality of mask layout features and the mask may include a plurality of mask features corresponding to the plurality of mask layout features. The mask layout may include one or more optical proximity correction features.

Another aspect of the present invention relates to a system for manufacturing a mask. The system includes a database, a processor, and a mask writer operatively coupled to the processor. The database includes one or more sizing correction data that are associated with the difference between a portion of a mask layout feature and a corresponding portion of a mask feature. The portion of the mask layout feature may be an optical proximity correction feature. The processor receives the one or more sizing correction data and modifies a mask layout in accordance with the one or more sizing correction data. The mask writer receives the modified mask layout and generates a mask in accordance with the modified mask layout. The processor and the mask writer may be components of a mask writer system. The system may be used to modify any type of mask layout, such as an optical proximity corrected mask layout.

Another aspect of the present invention relates to a data storage medium. The data storage medium includes one or more sizing correction data. The sizing correction data correspond to one or more area loss data, and the area loss data comprise substantially a difference between a mask layout feature and a mask feature. The area loss data may be determined by an edge detection technique, and the sizing corrections may be determined by inputting the area loss data to a processor operatively coupled to an algorithm for calculating the sizing correction data. The edge detection technique may include detecting one or more edges of the mask feature with a scanning electron microscope. The edge detection technique may further include generating one or more edge data, such as one or more radii of the mask feature. The area loss data may be determined by inputting the edge data into a processor that is operatively coupled to an algorithm for calculating the area loss data. The second mask layout may be modified in accordance with the sizing correction data stored in the data storage medium. A corrected mask may be written from the modified second mask layout. The data storage medium may contain sizing correction data corresponding to any portion of a mask feature, such as an optical proximity correction feature. The data storage medium may be used to modify any type of mask layout data, such as an optical proximity corrected mask layout.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a schematic illustration of a mask design layout feature;

FIG. 2 is a schematic illustration of a mask feature;

FIG. 3 is a schematic illustration of the area loss between the layout feature of FIG. 1 and the mask feature of FIG. 2;

FIG. 4 is a schematic illustration of a mask feature and the associated edge features.

DETAILED DESCRIPTION OF THE INVENTION

Figure 5A:
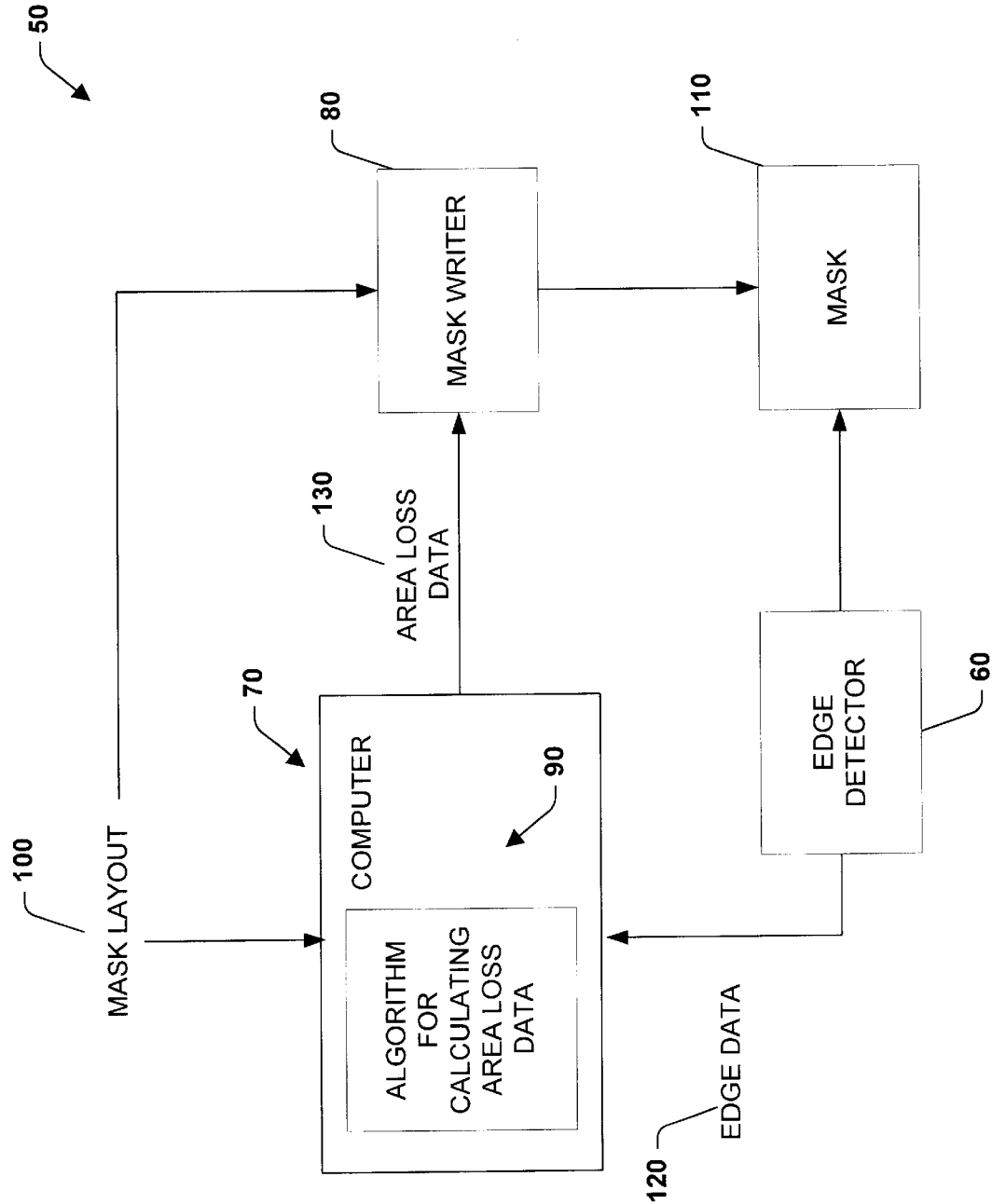
FIG. 5a is a schematic illustration of a system for manufacturing a mask in accordance with the present invention.

The present invention will now be described with reference to the drawings. The present invention will be described with reference to a system and method for manufacturing a photomask.

Referring initially to FIG. 1, a mask design layout feature 10 is shown. In general, as shown in FIG. 2, the mask feature 20, as written by the mask writer, can deviate from the layout feature 10. In FIG. 3, the difference between the layout data 10 and the mask features 20 as written, the area loss 30, is illustrated by the shaded regions. Each area loss 30 can be quantitatively characterized by its edge features 40. Edge features 40 can be quantified by edge data, such as the radius of a curved edge as shown in FIG. 4, or by any edge data suitable for calculating an area of a geometric space, such as the length of the portion of the mask feature. Moreover, edge data can be a mathematical equation that describes an irregular edge. The area loss is highly undesirable and if such a mask is used to form patterns on a semiconductor substrate, it would result in either degraded transistor performance, increased transistor layout spacing (which decreases device packing density), or both.

Quantitatively, the area loss, or Δ area, is substantially the difference between the area of the layout feature and the area of the mask feature. This can be represented by the following mathematical formula:

$$\text{area loss} = \Delta\text{area} = \text{area}_{layoutfeature} - \text{area}_{maskfeature}$$

The areas of the layout features and of the mask features can be determined by any method suitable for determining the area of a geometric space and are well known to those of average skill in the art. In general, an area loss can be determined by the features of the edges of the area loss, referred to as edge data. Edge data characterize a portion of the mask feature, such as the radius of curvature of the edge, the length of the edge, etc., and the like. For instance, an area loss that is substantially in the shape of a square is determined by multiplying the length of the side of the square by itself, i.e., squaring the length of the side. An area loss that is substantially in the shape of an equilateral triangle would be one-half of the square of the length of its side. An area loss that was substantially a circular shape can be substantially determined by squaring the length of the radius and multiplying by the constant $\pi$.

An irregularly shaped area loss can be substantially determined by subdividing the area loss into combinations of geometric shapes, calculating the area of those geometric shapes, and summing the areas. Alternatively, an irregularly shaped area loss can be substantially determined by using any of the well known methods for determining the area under a curve, such as standard calculus techniques. For instance, the edge of the irregularly shaped area loss can be described by a mathematical function, or equation, and then integrated, i.e., integrating the equation. In addition, any numerical analysis technique that can estimate or substantially determine an area is contemplated by the present invention and may be employed. Moreover, the scope of the area loss includes any difference between a portion of the mask layout features and the corresponding portion of the mask features, even those differences not quantified by area, for instance, a difference in length or shape.

The layout features 10 contemplated by the present invention include any feature desired on a substrate, including OPC features, such as serifs. The masks and the features thereon produced by the systems and methods of the present invention include any masks that are useful for transferring a pattern to a substrate, such as masks used in photolithography. Any type of mask writer, or mask writer system, can be used in the present invention, including electron beam (e-beam) and laser mask writers.

Turning now to FIG. 5*a*, a system for manufacturing a photomask is shown. The system 50 includes an edge detector 60, a computer 70, and a mask writer 80. The computer further includes an algorithm for calculating area loss data 90. In one aspect of the present invention, mask layout 100 (also called mask layout data) is input to the mask writer 80 to create a mask 110. The edge detector operates to determine edge data 120 associated with the generated mask. The computer 70 receives the edge data 120, and, using an algorithm for calculating area loss data 90, calculates area loss data 130. The mask writer 80 receives the area loss data 130. As discussed previously, the edge data 120 quantify the edge features 40 (shown in FIG. 4) of a portion of the mask feature 20 (also shown in FIG. 4). It is to be appreciated that any edge data that serves to characterize the edge, such as the radius of curvature of a curved edge, the length of the edge, and/or a mathematical expression is contemplated by the present invention.

Figure 5B:
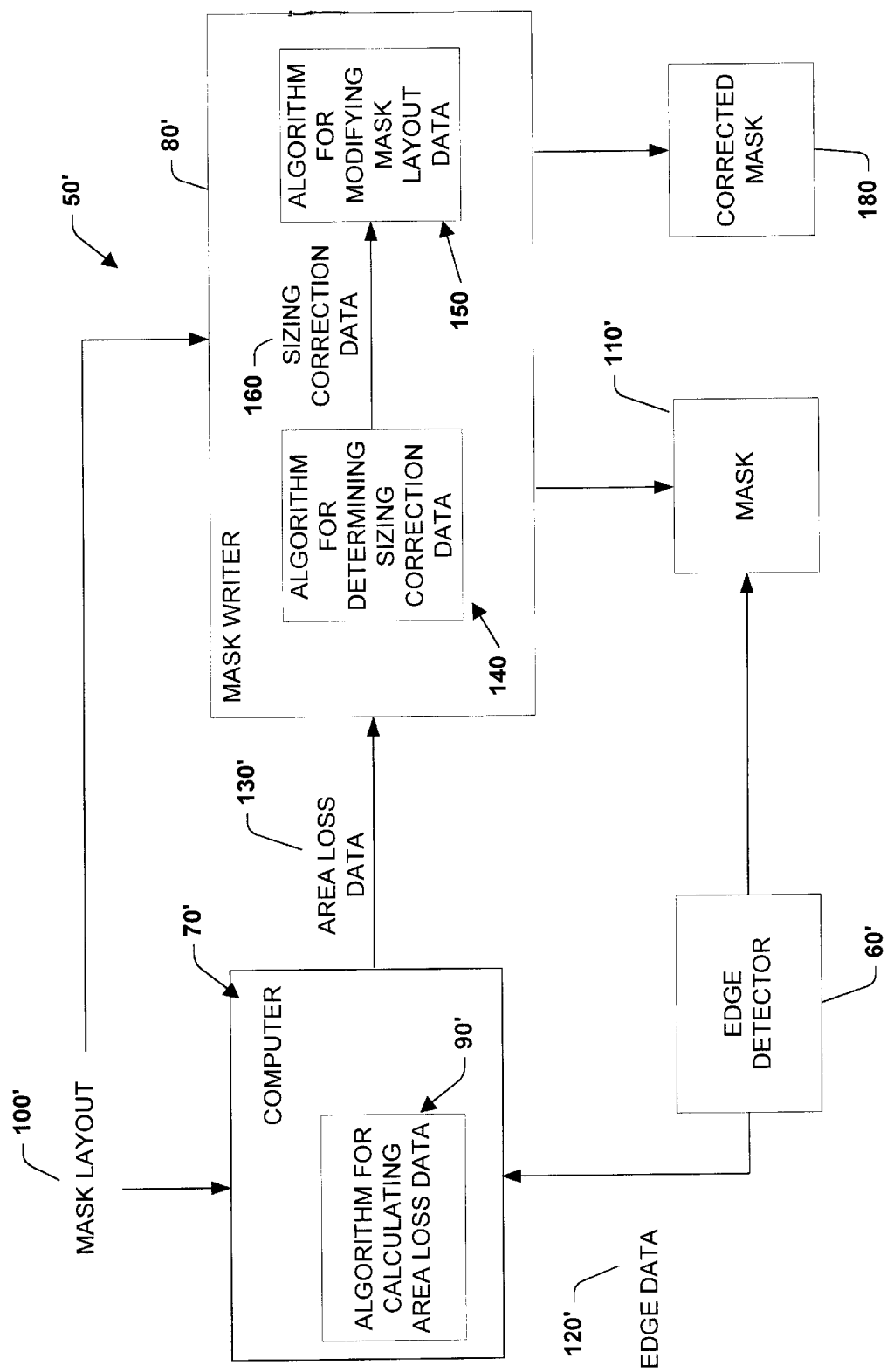
FIG. 5b is a schematic illustration of a system for manufacturing a mask in accordance with the present invention.
Figure 5C:
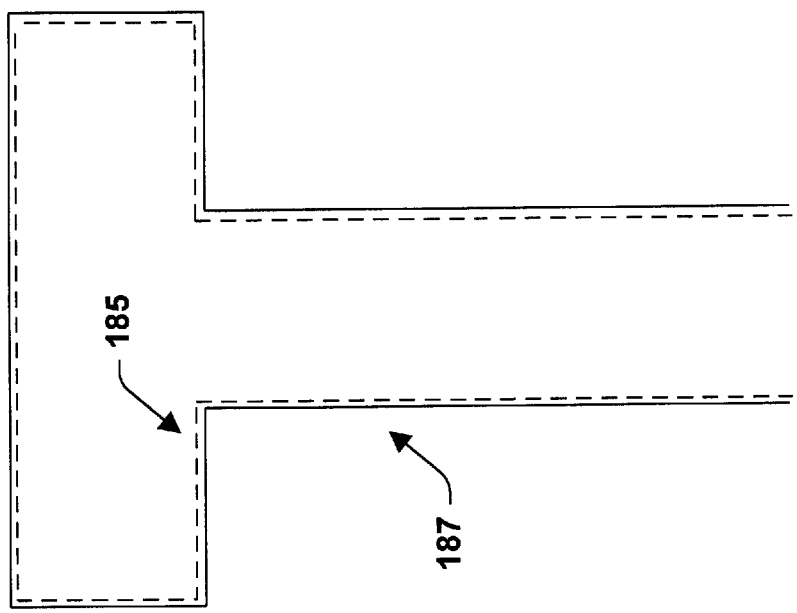
FIG. 5c is a schematic illustration of a corrected mask feature manufactured in accordance with the present invention.

In FIG. 5*b*, another system for manufacturing a mask is shown. The system 50' is similar to the system 50 of FIG. 5*a* and further includes an algorithm for determining sizing correction data 140 from the area loss data 130', and an algorithm for modifying the mask layout 150 from the sizing correction data 160. In one aspect of the system 50', the area loss data 130' is received by the mask writer 80', and the algorithm for determining sizing correction data 140 determines the sizing correction data 160 from the area loss data 130'. The algorithm for modifying the mask layout 150 modifies the mask layout data 100' in accordance with the sizing correction data 160. The mask writer 80' writes a corrected mask 180 according to the modified mask layout. FIG. 5*c* is an illustration of a corrected mask feature 185 (broken lines) and the intended mask layout feature 187 (intact lines). The corrected mask feature 185 produced by the systems and methods of the present invention substantially approximates the intended mask layout feature 187.

According to one aspect of the present invention, the algorithm for modifying the mask layout data segments the area losses (see, e.g., FIG. 3) into area loss regions corresponding, for example, to a feature characteristic (e.g., an outer corner, an inner corner, a straight line, a rounded region) and correlates the area loss associated with the particular area loss region to a mask layout data modification (a sizing correction, e.g., a serif or other correction structure having a predetermined dimension corresponding to the area loss). Such a correlation may be effectuated, for example, by a look up table, although other forms of correlation may also be utilized and are contemplated as falling within the scope of the present invention. It should be noted that some area loss regions may be positive or negative, meaning that in some regions a portion of a mask feature is missing where the feature is intended to be, and in other regions the mask feature may extend into a region where the feature is not intended (see, e.g., an interior corner region of FIG. 3). Although the above look up table correlation is one exemplary manner of employing an algorithm for modifying the mask layout data, other algorithms or methods employing, for example, numerical analysis, neural networks, expert systems, etc., may also be utilized and are contemplated as falling within the scope of the present invention.

Figure 5D:
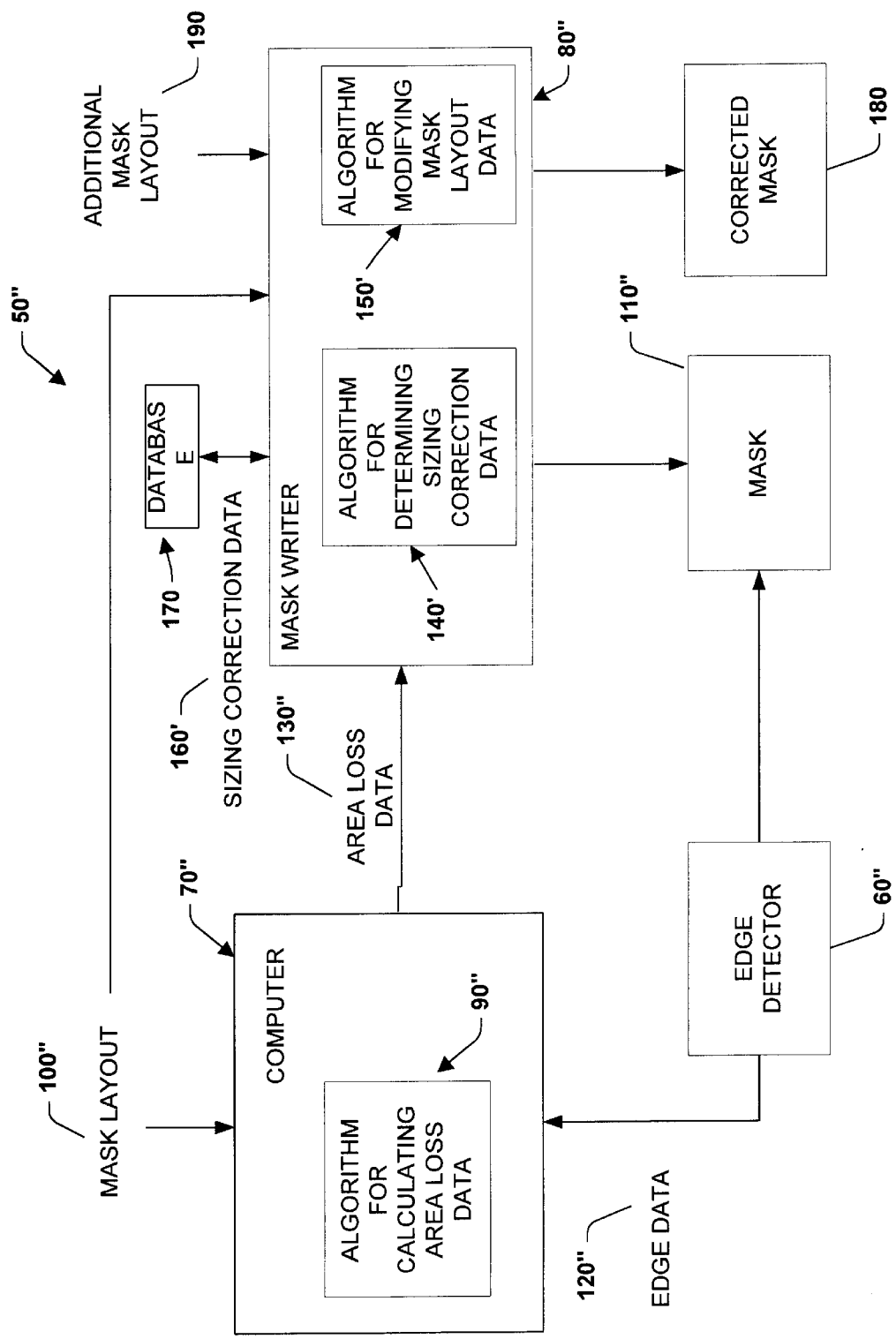
FIG. 5d is a schematic illustration of a system for manufacturing a mask in accordance with the present invention.

Alternatively, as shown in FIG. 5*d*, a system of the present invention 50" includes a database 170 operatively coupled to the mask writer 80" to store the sizing correction data 160'. The mask layout data to be modified is from an additional mask layout 190. The mask writer 80" writes a corrected mask 180' according to the modified additional mask layout.

Figure 6A:
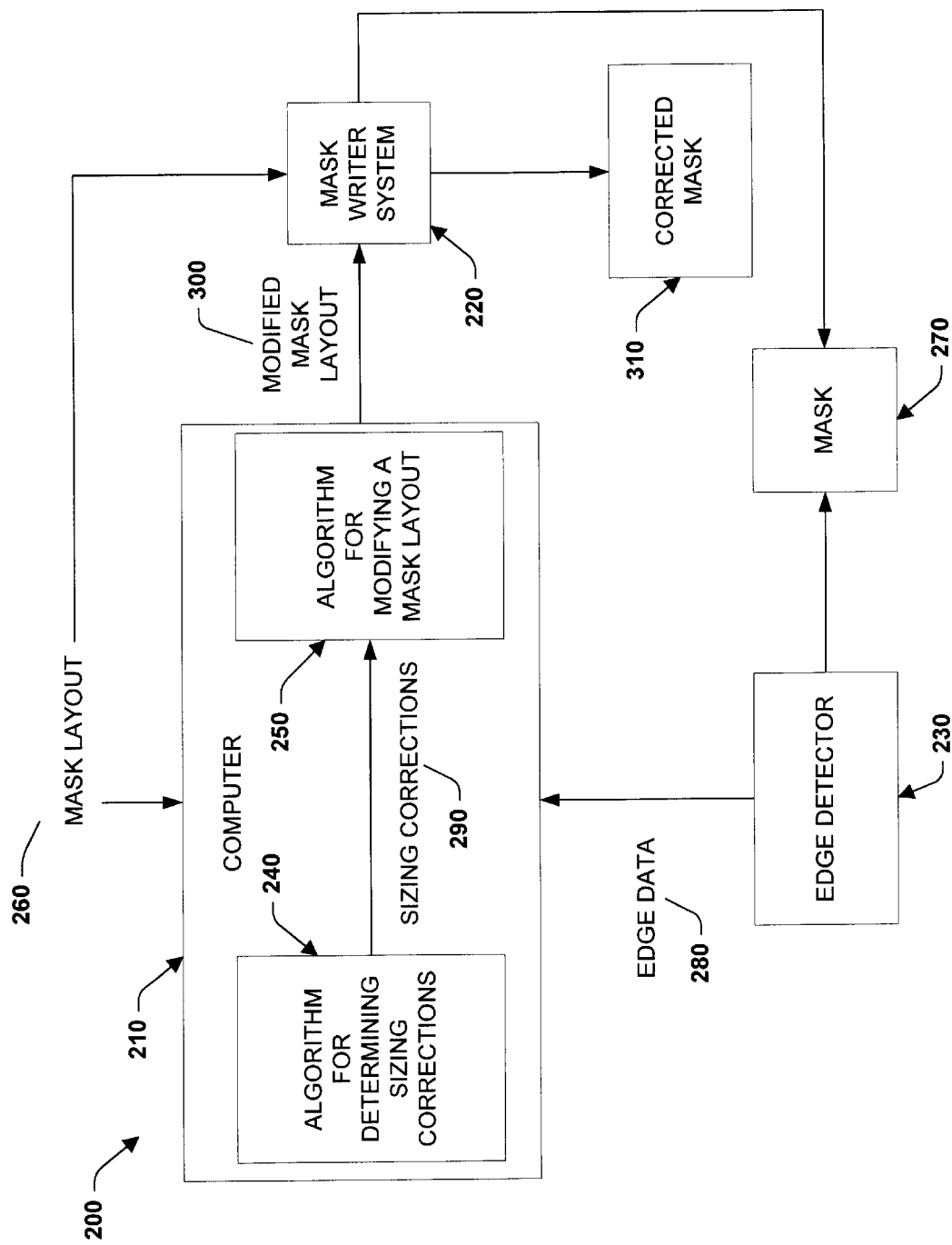
FIG. 6a is a schematic illustration of a system for manufacturing a mask in accordance with the present invention.

FIG. 6*a* shows a system for manufacturing a mask. The system 200 includes a computer 210, a mask writer system 220, and an edge detector 230. The computer 210 includes an algorithm for determining sizing corrections 240, and an algorithm for modifying a mask layout 250. A mask layout 260 is received by the mask writer system 220, and a mask 270 is written. The mask 270 is examined by the edge detector 230 and edge data 280 is generated. The edge data 280 and the mask layout 260 are received by the computer 210, and sizing corrections 290 are determined by the algorithm for determining sizing corrections 240, for instance by calculating the difference between the area of the mask layout features and the mask features as written. The mask layout 260 is modified in accordance with the sizing corrections 290. The modified mask layout 300 is received by the mask writer system 220, and a corrected mask 310 is written by the mask writer system 220. An illustration of a corrected (modified) mask feature 185 is shown in FIG. 5c.

Figure 6B:
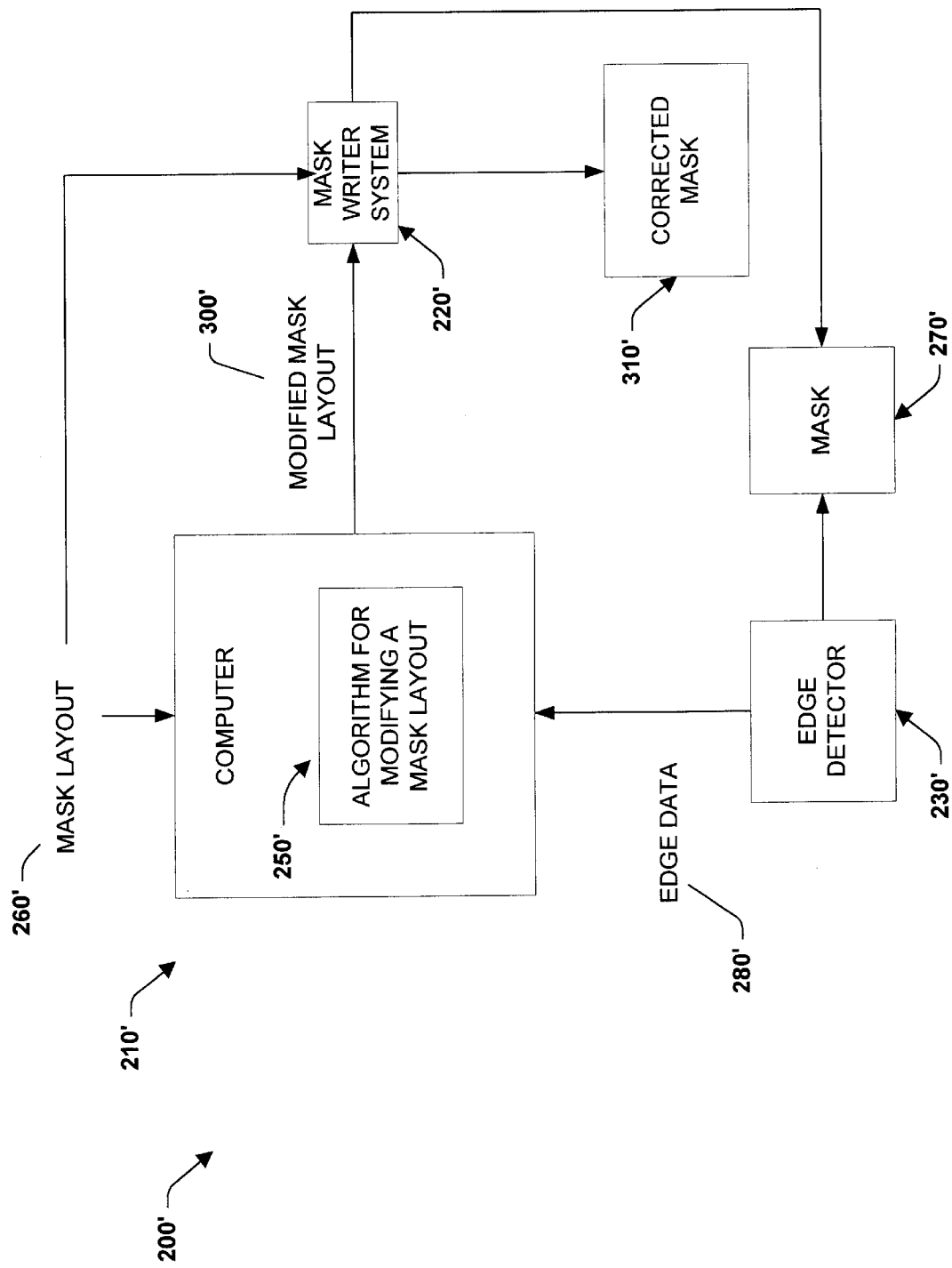
FIG. 6b is a schematic illustration of a system for manufacturing a mask in accordance with the present invention.

Alternatively, the computer 210' can have an algorithm for modifying a mask layout 250', as shown in FIG. 6b. The computer 210' receives the mask layout 260' and the edge data 280', and the algorithm 250' modifies the mask layout 260' in accordance with the edge data 280', for instance by calculating the difference between the area of the mask layout features and the mask features as written. The modified mask layout 300' is received by the mask writer system 220', and a corrected mask 310' is written by the mask writer system 220'.

Figure 7A:
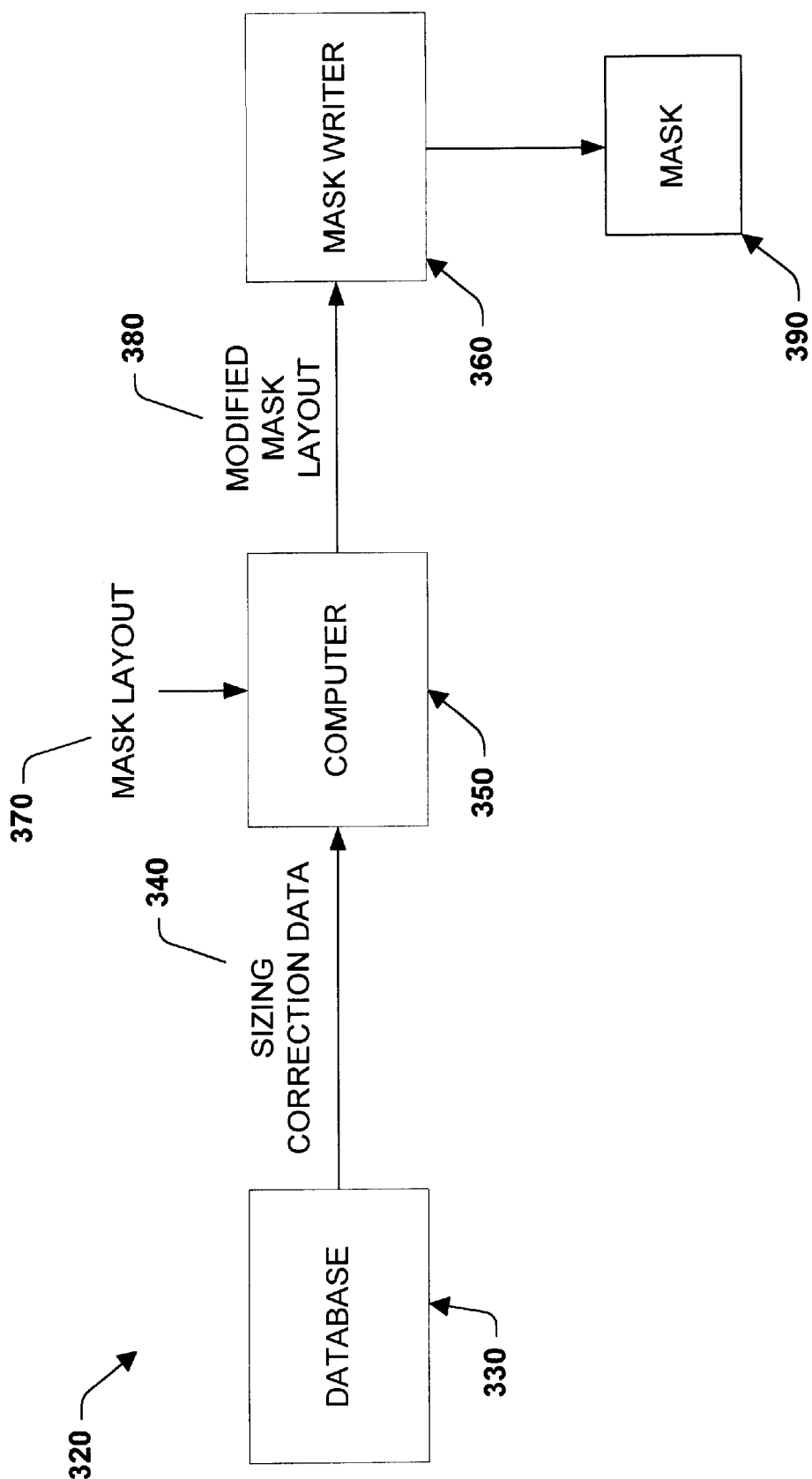
FIG. 7a is a schematic illustration of a system for manufacturing a mask in accordance with the present invention.

FIG. 7a shows a system for manufacturing a mask in accordance with the present invention. The system 320 includes a database 330 containing sizing correction data 340, a computer 350, and a mask writer 360. The database can be generated from data produced from one or more test masks, and a system such as one or more of those shown in FIG. 5a, 5b, 5d, 6a and 6b. The computer 350 receives the sizing correction data 340 and a mask layout 370. The computer 350 modifies the mask layout 370 in accordance with the sizing correction data 340. The mask writer 360 receives the modified mask layout 380 and writes a mask 390. The features of the mask 390 produced by the modified mask layout 380 better approximate the intended mask layout features as illustrated in FIG. 5c by the corrected (modified) mask feature 185.

Figure 7B:
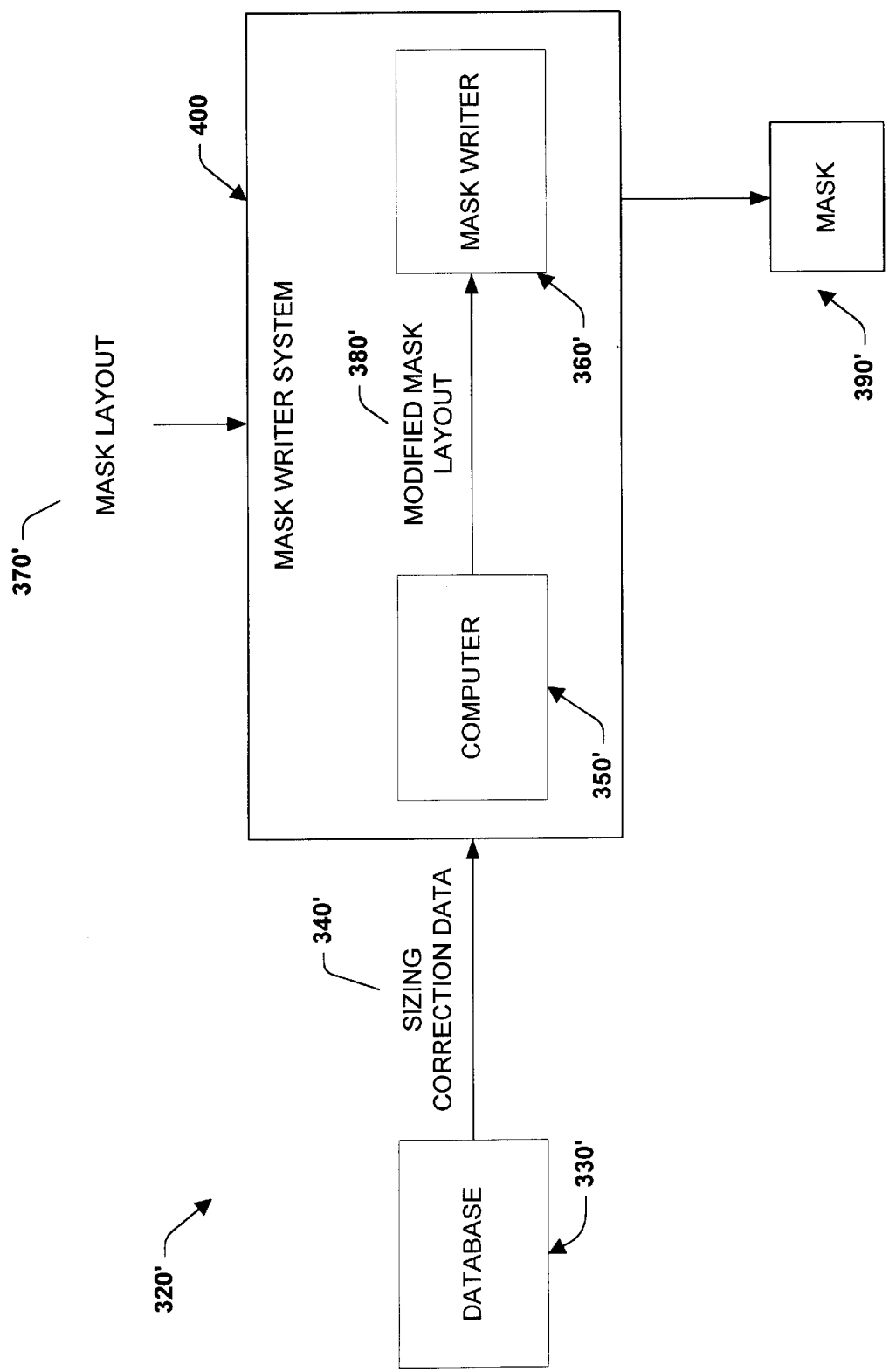
FIG. 7b is a schematic illustration of a system for manufacturing a mask in accordance with the present invention.

Another system for manufacturing a mask is illustrated in FIG. 7b. The system 320' includes a database 330' containing sizing correction data 340', and a mask writer system 400. The mask writer system 400 includes a computer 350' and a mask writer 360'. The mask writer system 400 receives the sizing correction data 340' and the mask layout 370'. The computer 350' modifies the mask layout 370' according to the sizing correction data 340'. The mask writer 360' writes a mask 390' according to the modified mask layout 380'.

The edge detectors for use in the present invention can be any device or methodology suitable for detecting and characterizing an edge feature. It is to be appreciated that the systems and methodology of the present invention may be applied to substantially any analytical system providing a shaped signal based on the geometry and/or topology of the surface being measured, such as a scanning electron microscope (SEM). In one aspect of the present invention, the edge detector is a critical dimension scanning electron microscope (CD-SEM).

Figure 8:
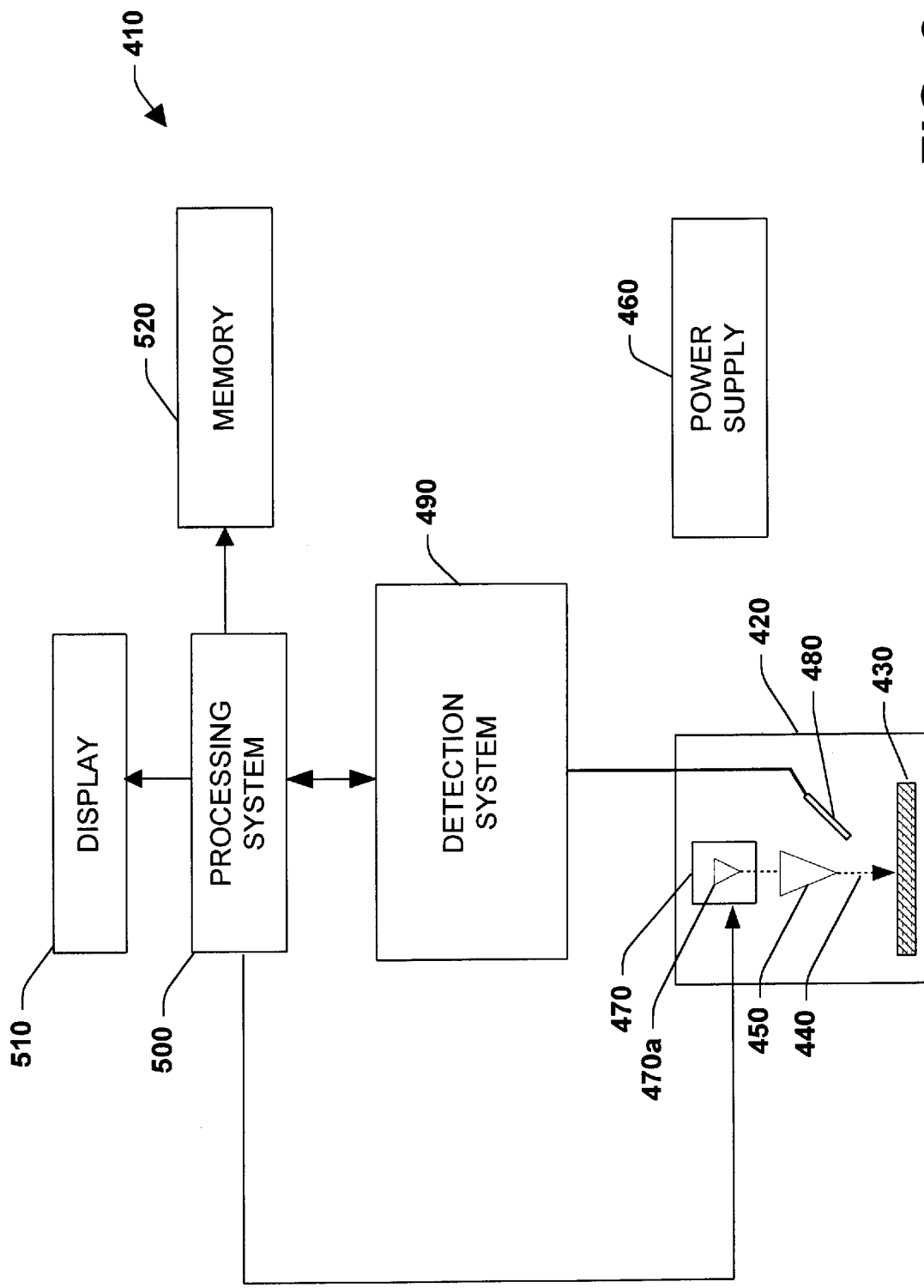
FIG. 8 is a schematic illustration of a scanning electron microscope system.

Now referring to FIG. 8, an exemplary CD-SEM system 410 for detecting edge features is shown. The system includes a chamber 420 for housing a mask 430. An electron beam 440 is directed from an electromagnetic lens 450 toward the mask 430. The electron beam 440 is created from high voltage supplied by a power supply 460 associated with a beam generating system 470 which includes an emission element 470a. Various directing, focusing, and scanning elements (not shown) in the beam generating system 470 guide the electron beam 440 from the emission element 470a to the electromagnetic lens 450. The electron beam particles may be accelerated to energies from about 500 eV to 40 Kev.

When the electron beam 440 strikes the surface of the mask 430, electrons and x-rays are emitted which are detected by a detector 480 and are provided to a detection system 490. The detection system 490 provides digitized detector signals to a processing system 500 for performing conventional critical dimension measurements, edge feature measurements, and signal analysis in accordance with the present invention.

The electrons emitted from the surface of the wafer 430 that are most useful for critical dimension imaging are known as secondary electrons and provide a substantial amount of the signal current received by the detector 480. An edge feature image and dimensions may also be directed to a display 510 by the processing system 500. The processing system 500, in addition to analyzing data received by the detection system 490, synchronizes the scanning of the display 510 with electron beam scanning of the mask 430 to provide the image. Contrast of the displayed image is related to variations in the flux of electrons arriving at the detector 480 and is related to the yield of emitted electrons from the surface of the mask 430 to the incident electrons from the electron beam 440.

The detection system 490 receives the electron emissions from the mask surface via the detector 480 and digitizes the information for the processing system 500. In addition, the detection system 490 may also provide filtering or other signal processing of the received signal. The processing system 500 provides edge feature dimension information characterizing the mask edge features to the display 510, and/or stores information in a memory 520.

A processor (not shown) is included in the processing system 500 for controlling the beam generating system 470, providing edge feature measurements, and for performing signal analysis in accordance with the present invention. It is to be appreciated that a plurality of processors and/or processing systems may be included as part of and/or external to the CD-SEM system 410 for performing signal analysis in accordance with the present invention. The processor in the processing system 500 is programmed to control and operate the various components within the CD-SEM system 410 in order to carry out the various functions described herein. The processor may be any of a plurality of processors, such as the AMD Athlon, K6 or other type architecture processors. The manner in which the processor may be programmed to carry out the functions relating to the present invention will be readily apparent to those having ordinary skill in the art based on the description provided herein and are omitted herein for the sake of brevity.

A memory 520 is also included in the system 410. The memory 520 is operatively coupled to the processing system 500 and serves to store program code executed by the processor for carrying out operating functions of the system 410 as described herein. The memory 520 also serves as a storage medium for temporarily storing information such as edge feature data, statistical data, and other data which may be employed in carrying out the present invention.

The power supply 460 also provides operating power to the CD-SEM system 410 along with providing a high voltage to the beam generating system 470. Any suitable power supply (e.g., linear, switching) may be employed to carry out the present invention.

Figure 9:
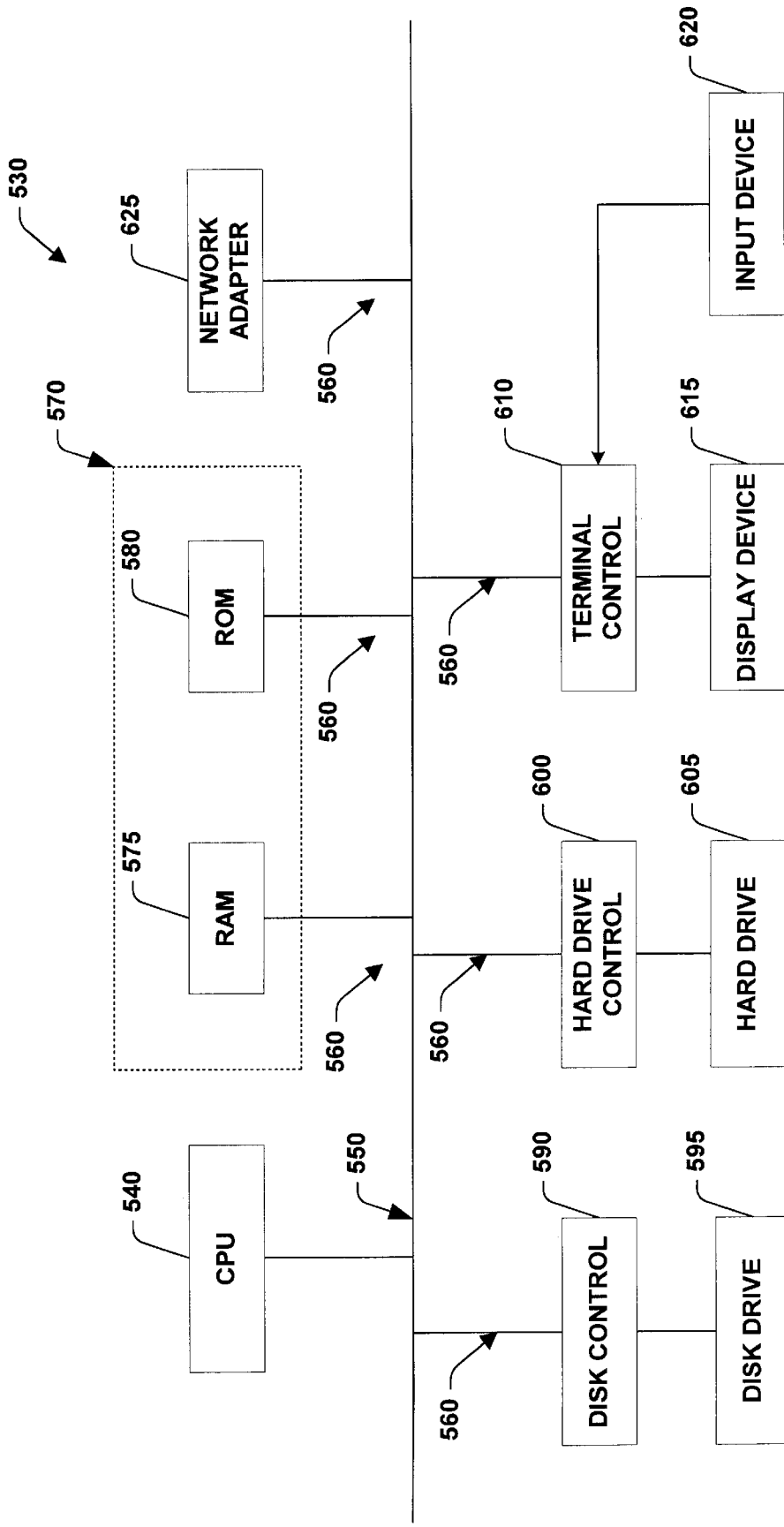
FIG. 9 is a schematic illustration of a computer in accordance with one aspect of the present invention.

FIG. 9, is a detailed block diagram of a computer 530 in accordance with the present invention. This computer 530 may be employed in the systems and methodology of the present invention. It is to be appreciated that the computers of the present invention may include a single computer system or a plurality of computer systems.

The computer 530 includes a central processing unit (CPU) 540 which is coupled to a bus 550. It is to be appreciated that a CPU or processor 540 with or without any other associated hardware can function as a computer, and is contemplated as within the scope of a computer by the present invention. The CPU or processor 540 can be any of a plurality of processors, such as the AMD Athlon, K-6, and any other processors. It will be appreciated that since the present invention provides for a multi-platform environment as described in greater detail below, any processor and/or computer suitable for carrying out the functions of the present invention may be employed. The processor 540 functions to perform various operations described herein, as well as any other operations related to the system 530. The manner in which the processor 540 can be programmed to carry out the functions relating to the present invention will be readily apparent to those having ordinary skill in the art based on the description provided herein.

The bus 550 includes a plurality of signal lines 560 for conveying addresses, data and controls between the CPU 540 and a number of other system bus components. The other system bus components include a memory 570 (including a Random Access Memory (RAM) 575 and a Read Only Memory (ROM) 580) and a plurality of input/output (I/O) devices. The memory 570 serves as data storage and may store appropriate operating code to be executed by the processor 540 for carrying out the functions described herein. The processor 540 itself may include associated hardware, such as RAM or ROM and I/O devices.

The RAM 575 provides program instruction storage and working memory for the CPU 540. The ROM 580 contains software instructions known as the Basic Input/Output System (BIOS) for performing interface operations with the I/O devices.

Also stored in the ROM 580 is a software routine which operates to load a boot program from the booting device. The boot program will typically be executed when the computer system 530 is powered on or when initialization of the system 530 is needed.

The I/O devices include basic devices such as data storage devices (e.g., floppy disks, tape drives, CD ROMs, hard disks). Typically, the I/O devices communicate with the CPU 540 by generating interrupts. The CPU 540 distinguishes interrupts from among the I/O devices through individual interrupt codes assigned thereto. Responses of the CPU 540 to the I/O device interrupts differ, depending, among other things, on the devices generating the interrupts. Interrupt vectors are provided to direct the CPU 540 to different interrupt handling routines.

The interrupt vectors are generated during initialization (e.g., boot up) of the computer system 530 by execution of the BIOS. Because responses of the CPU 540 to device interrupts may need to be changed from time to time, the interrupt vectors may need to be modified from time to time in order to direct the CPU 540 to different interrupt handling routines. To allow for modification of the interrupt vectors, they are stored in the RAM 575 during operation of the computer 530.

A disk control subsystem 590 bidirectionally couples one or more disk drives 595 (e.g., floppy disk drives, CD-ROM drives, etc.) to the system bus 550. The disk drive 595 works in conjunction with a removable storage medium such as a floppy diskette or CD-ROM.

A hard drive control subsystem 600 bidirectionally couples a rotating fixed disk, or hard drive 605 to the system bus 550. The hard drive control subsystem 600 and hard drive 605 provide mass storage for CPU instructions and data.

A terminal control subsystem 610 is also coupled to the bus 550 and provides output to a display device 615, typically a cathode ray tube ("CRT") or liquid crystal display ("LCD") monitor, and receives inputs from a manual input device 620 such as a keyboard. Manual input may also be provided from a pointing device such as a mouse. A network adapter 625 is provided for coupling the system 530 to a network.

One of the implementations of the present invention is as several sets of instructions in a code module resident in the main memory (e.g., RAM 575). Until required by the computer system 530, the sets of instructions may be stored in another computer memory, for example, in a hard disk drive, or in a removable memory such as an optical disk for eventual use in a CD-ROM or a floppy disk for eventual use in the floppy disk drive.

Figure 10:
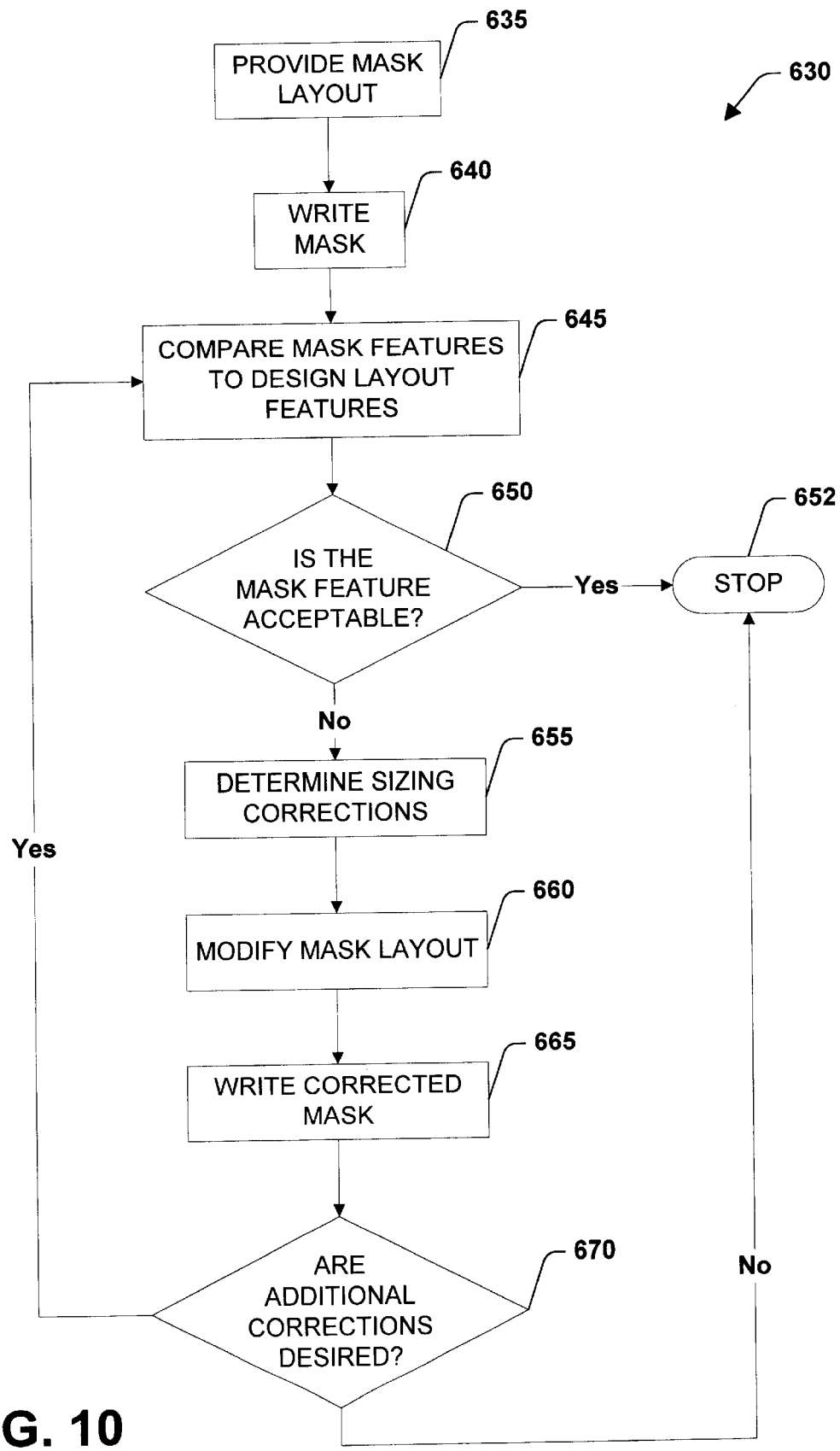
FIG. 10 is a flowchart illustrating a method of manufacturing a mask in accordance with one aspect of the present invention.

Turning now to FIG. 10, a flowchart illustrates a method 630 for improving the manufacture of a mask in accordance with the present invention. The method begins at step 635 in which a mask layout is provided, the mask layout data being generated in accordance with a desired set of features to be formed on the mask. Although the figures illustrated in conjunction with the present invention have illustrated only one or more features for the sake of simplicity, it should be understood that the present invention applies to mask layouts associated with a plurality of mask features, including tens, hundreds, thousands, millions, and even more features on the mask.

Once the mask layout is provided, a mask is written in step 640. In step 645, the mask features are compared to the corresponding mask layout features. This step can be implemented, for instance, by determining the area loss of the mask feature. The area loss data can be determined, for instance, by an edge detection technique such as characterizing the edge features of the mask features using an SEM, and by generating edge data. One example of edge data is the radius of the mask feature. The area loss data can be calculated from the edge data, for instance, by inputting the edge data into a computer. Although area loss is one exemplary technique for comparing features, various other methodologies may be employed and are contemplated as falling within the scope of the present invention.

At step 650, a determination of whether the mask feature is acceptable is made. If the answer is in the affirmative (YES), then the process stops (step 652). This determination can be carried out for each mask feature individually, or for all the mask features simultaneously. The acceptability of the mask features can be determined by any suitable method, such as comparing the area loss to a predetermined set of tolerance values. For instance, the mask layout data corresponding to mask features that exhibit an area loss below a certain tolerance value would not be modified. For mask features that exhibit an area loss at or above a certain tolerance value, the corresponding mask layout data would be modified. Step 650 can be automated by a computer or performed manually.

If, however, at step 650 it is determined that the mask feature is not acceptable (NO), then the method proceeds to step 655 and sizing corrections are determined. Step 650 can be implemented, for instance, by inputting the area loss data into a computer to determine the adjustments to the mask writer that are required to correct for the area loss. The computer can be the computer system of a mask writer, or a separate computer programmed to make the sizing correction determinations. In step 660, the mask layout data is modified by the sizing corrections and in step 665, a corrected (modified) mask is written. The mask layout to be modified in step 660 can be the original mask layout provided, or a different set of mask layout data. Steps 655 and 660 can be combined into one step (not shown) wherein, the modifications to the mask layout data are made directly from the comparison data from step 645, for instance from the area loss data. In step 670, a determination is made whether additional corrections are desired. If the answer is affirmative (YES), then the method 630 returns to step 645, and the corrected mask features are compared to the design layout features. If the answer is negative (NO), then the method 630 stops (step 652).

The determination of whether additional correction are desired can be made prior to step 63 5 (not shown) or at any other point in the method, or step 670 can be omitted entirely (not shown).

The sizing corrections determined in step 655 can also be stored in a database for use in modifying the original mask layout data or any other mask layout. For example, a mask layout with a variety of desired mask features can be provided and, using the method of 630, sizing corrections can be determined. These sizing corrections can then be stored in a database for use in modifying another mask layout having a variety of desired mask features in a similar or in a different arrangement. The database of sizing corrections can be stored in a data storage medium.

Figure 11:
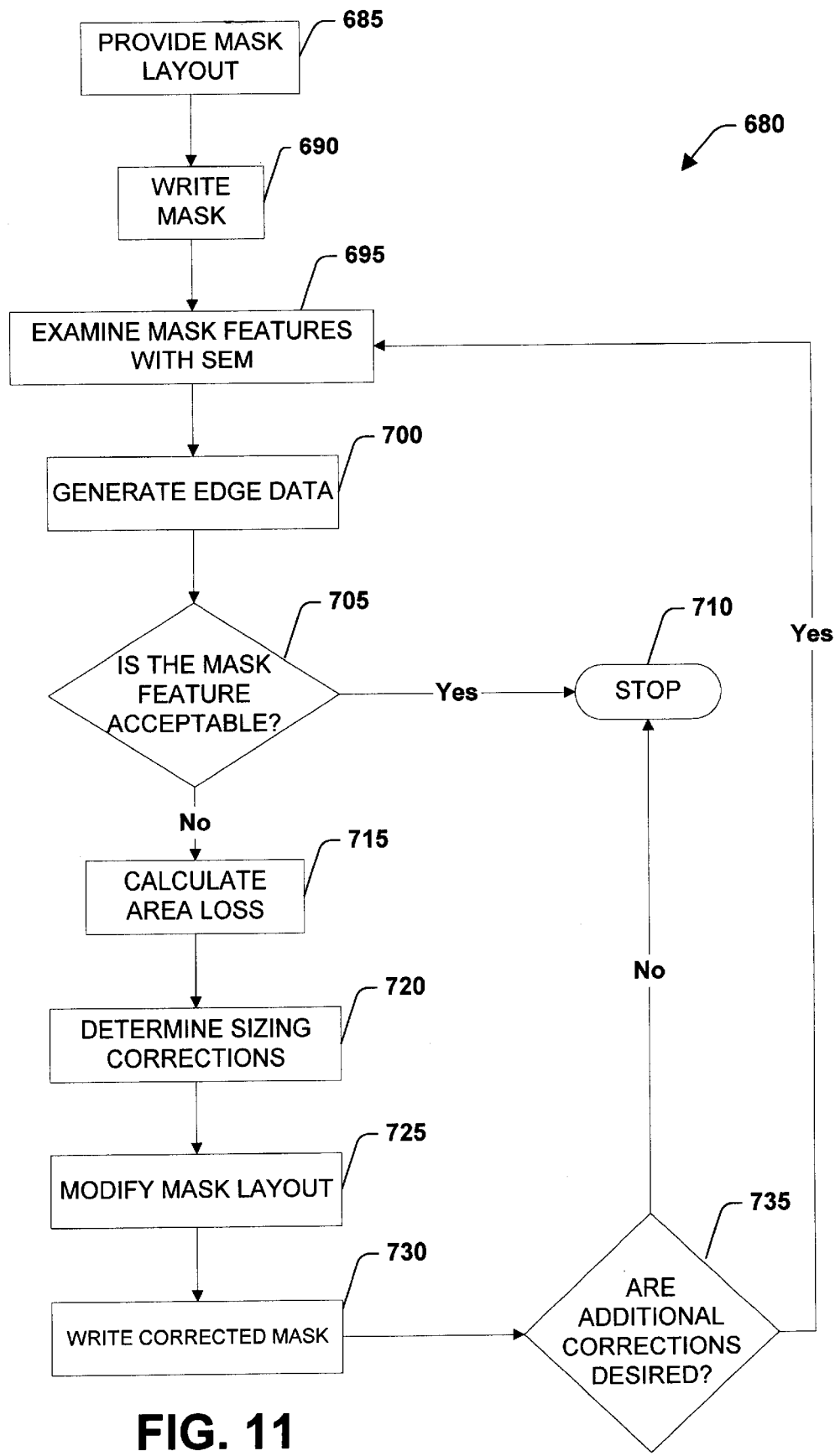
FIG. 11 is a flowchart illustrating a method of manufacturing a mask in accordance with one aspect of the present invention.

In FIG. 11, a flowchart illustrates a method 680 for improving the manufacture of a mask in accordance with the present invention. The method begins at step 685 in which a mask layout is provided, the mask layout data being generated in accordance with a desired set of features to be formed on the mask. A mask is written in step 690. In step 695, the mask features are examined with an analysis tool, for example, an SEM. In step 700, edge data are generated, for instance from edge features. One example of edge data is the radius of the mask feature; another example is the length of a mask feature.

In step 705, a determination of whether the mask feature is acceptable can be made. If the answer is in the affirmative (YES), then the process stops (step 710). This determination can be carried out for each mask feature individually, or for all the mask features simultaneously. The acceptability of the mask features can be determined by any suitable method, such as comparing the edge data to the mask layout data. For instance, if the edge data deviates from the mask layout data less than a certain tolerance value, that mask layout feature would not be modified. For edge data that exhibit a deviation at or above a certain tolerance value, the corresponding mask layout feature would be modified. Step 705 can be automated by a computer or performed manually.

If, however, at step 705 it is determined that the mask feature is not acceptable (NO), then the method proceeds to step 715 and the area loss is calculated. The area loss data can be calculated from the edge data, for instance, by inputting the edge data into a computer, which is programmed to calculate the area loss. In step 720, the sizing corrections can be determined, for instance, by inputting the area loss data into a computer to determine the adjustments to the mask writer that are required to correct for the area loss. The computer can be the computer system of a mask writer, or a separate computer programmed to make the sizing correction determinations. In step 725, the mask layout is modified by the sizing corrections, and in step 730, a corrected (modified) mask is written. The mask layout to be modified in step 730 can be the original mask layout provided, or a different set of mask layout data. Steps 720 and 725 can be combined into one step (not shown) wherein, the modifications to the mask layout data are made directly from the edge data from step 700. In step 735, a determination is made if additional corrections are desired. If the answer is affirmative (YES), then the method 680 returns to step 695, and the corrected mask features are examined with an SEM. If the answer is negative (NO), then the method 680 stops (step 710). The determination of whether additional correction are desired can be made prior to step 685 (not shown) or at any other point in the method, or step 735 can be omitted entirely (not shown).

The sizing corrections determined in step 720 can also be stored in a database for use in modifying the original mask layout data or any other mask layout. For example, a mask layout with a variety of desired mask features can be provided and, using the method of 680, sizing corrections can be determined. These sizing corrections can then be stored in a database for use in modifying another mask layout having a variety of desired mask features in a similar or in a different arrangement. The database of sizing corrections can be stored in a data storage medium.

Figure 12:
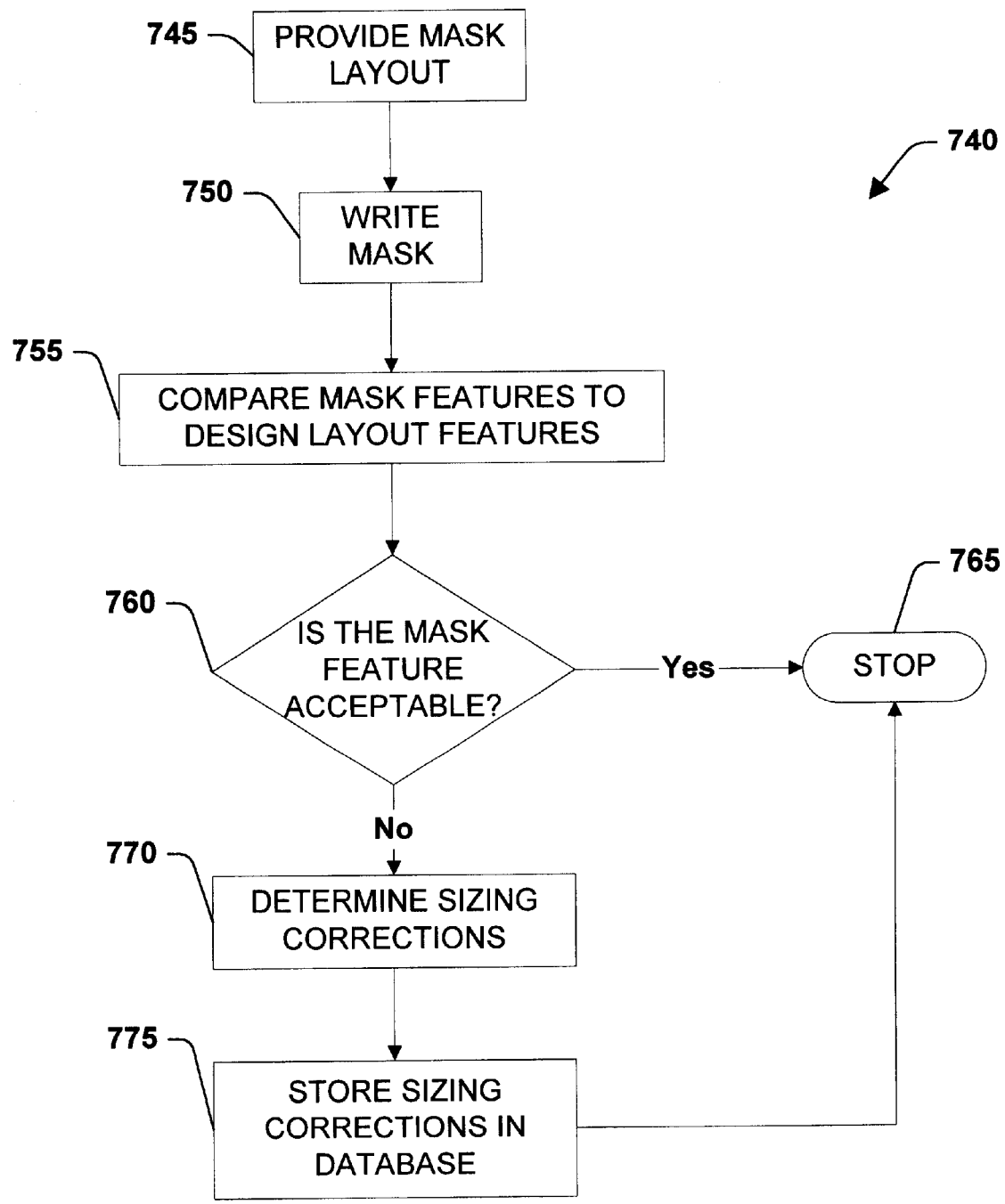
FIG. 12 is a flowchart illustrating a method of manufacturing a mask in accordance with one aspect of the present invention.

FIG. 12 shows a flowchart illustrating a method 740 for improving the manufacture of a mask in accordance with the present invention. The method begins at step 745 in which a mask layout is provided, the mask layout data being generated in accordance with a desired set of features to be formed on the mask. Once the mask layout data is provided, a mask is written in step 750. In step 755, the mask features as written are compared to the corresponding mask layout features. This step can be implemented, for instance, by determining the area loss of the mask feature. The area loss data can be determined, for instance, by an edge detection technique such as characterizing the edge features of portions of the mask features using an SEM. Edge data can be generated from the edge features, for example, the radius of a portion of the mask feature or the length of a portion of the mask feature. The area loss data can be calculated from the edge data, for instance, by inputting the edge data into a computer that is programmed to calculate the area loss.

At step 760, a determination of whether the mask feature is acceptable can be made. If the answer is in the affirmative (YES), then the process stops (step 765). This determination can be carried out for each mask feature individually, or for all the mask features simultaneously. The acceptability of the mask features can be determined by any suitable method, such as comparing the area loss to a predetermined set of tolerance values. For instance, the mask layout data corresponding to mask features that exhibit an area loss below a certain tolerance value would not be modified. For mask features that exhibit an area loss at or above a certain tolerance value, the corresponding mask layout data would be modified. Step 760 can be automated by a computer or performed manually.

If, however, at step 760 it is determined that the mask feature is not acceptable (NO), then the method proceeds to step 770 and sizing corrections are determined. Step 760 can be implemented, for instance, by inputting the area loss data into a computer to determine the adjustments to the mask writer that are required to correct for the area loss. The computer can be the computer system of a mask writer, or a separate computer programmed to make the sizing correction determinations. In step 775 the sizing corrections can be stored in a database. This database can be used for modifying the originally provided mask layout data or any other mask layout. For example, a mask layout with a variety of desired mask features can be provided and, using the method of 740, and sizing corrections can be determined and stored in a database. These sizing corrections can then be used in modifying another mask layout having a variety of desired mask features in a similar or in a different arrangement. The database of sizing corrections can be stored in a data storage medium.

Figure 13:
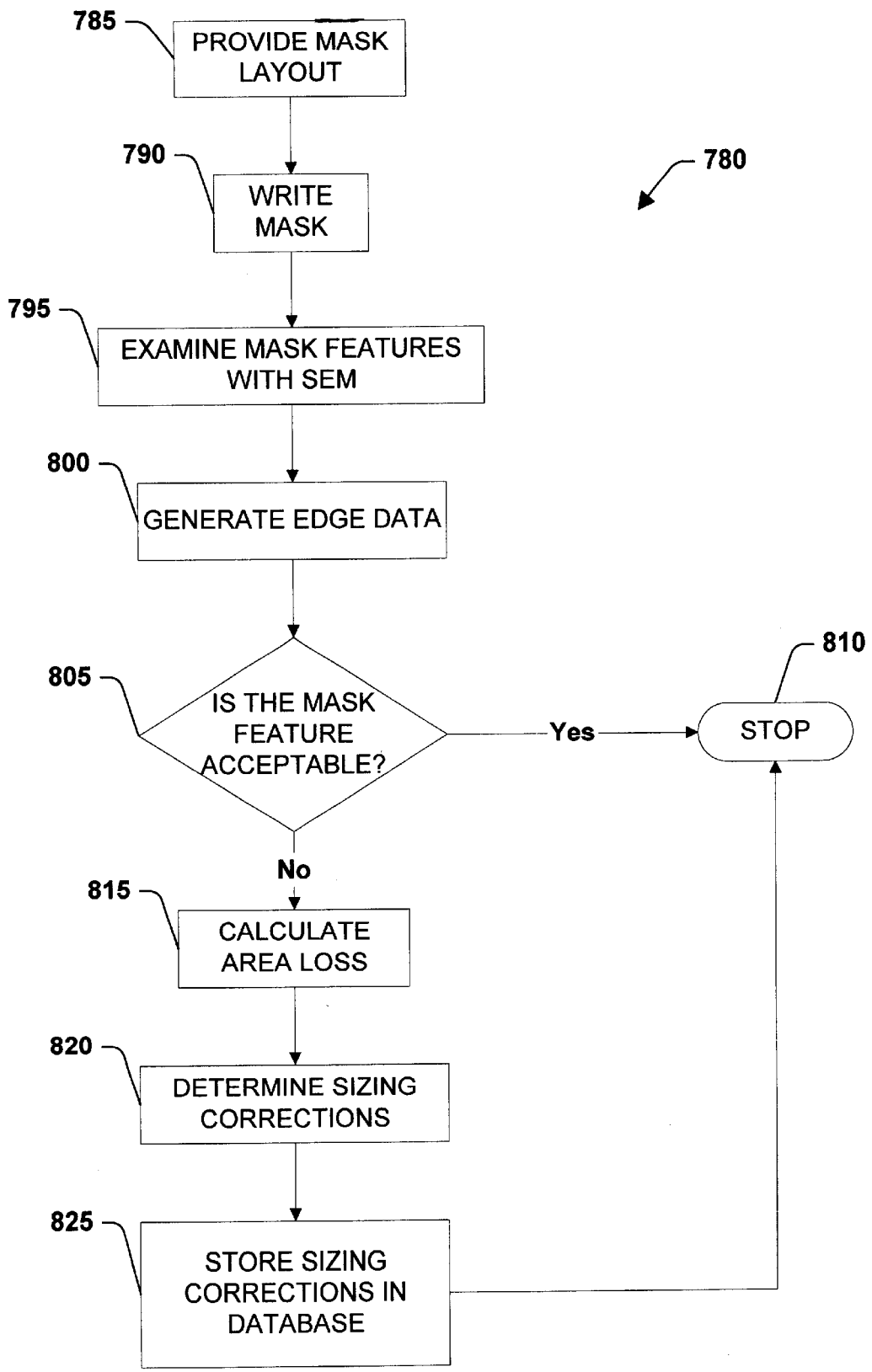
FIG. 13 is a flowchart illustrating a method of manufacturing a mask in accordance with one aspect of the present invention.

In FIG. 13, a flowchart illustrates a method 780 for improving the manufacture of a mask in accordance with the present invention. The method begins at step 785, in which a mask layout is provided, the mask layout data being generated in accordance with a desired set of features to be formed on the mask. A mask is written in step 790. In step 795, the mask features are examined with an SEM, and in step 800, edge data are generated. One example of edge data is the radius of a portion of the mask feature; another example is the length of a portion of a mask feature. In step 805, a determination of whether the mask feature is acceptable can be made. If the answer is in the affirmative (YES), then the process stops (step 810). This determination can be carried out for each mask feature individually, or for all the mask features simultaneously. The acceptability of the mask features can be determined by any suitable method, such as comparing the edge data to the mask layout data. For instance, if the edge data deviates from the mask layout data less than a certain tolerance value, that mask layout feature would not be modified. For edge data that exhibit a deviation at or above a certain tolerance value, the corresponding mask layout feature would be modified. Step 805 can be automated by a computer or performed manually.

If, however, at step 805 it is determined that the mask feature is not acceptable (NO), then the method proceeds to step 815 and the area loss is calculated. The area loss data can be calculated from the edge data, for instance, by inputting the edge data into a computer that is programmed to calculate the area loss. In step 820, the sizing corrections can be determined, for instance, by inputting the area loss data into a computer to determine the adjustments to the mask writer that are required to correct for the area loss. The computer can be the computer system of a mask writer, or a separate computer programmed to make the sizing correction determinations. In step 825, the sizing corrections are stored in a database. The sizing corrections stored in the database can be used for modifying the originally provided mask layout data or any other mask layout. For example, a mask layout with a variety of desired mask features can be provided and, using the method of 780, sizing corrections can be determined. These sizing corrections are then be stored in a database for use in modifying another mask layout having a variety of desired mask features in a similar or in a different arrangement. The database of sizing corrections can be stored in a data storage medium.

Figure 14:
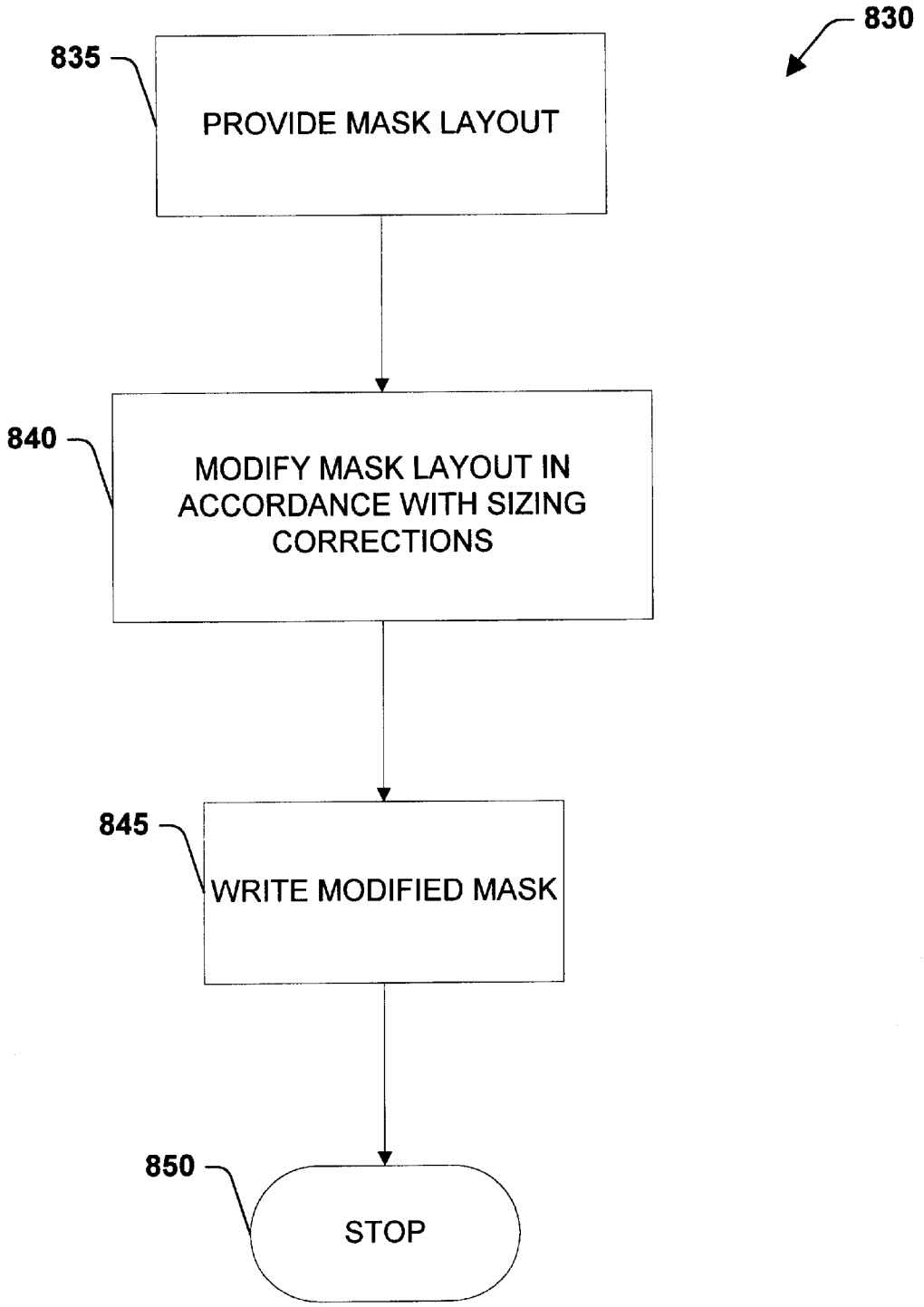
FIG. 14 is a flowchart illustrating a method of manufacturing a mask in accordance with one aspect of the present invention.

In FIG. 14, a method 830 for improving the manufacture of a mask is illustrated. In step 835, a mask layout is provided, the mask layout data being generated in accordance with a desired set of features to be formed on the mask. In step 840, the mask layout data is modified in accordance with sizing corrections. The sizing corrections can be stored in a database. It is to be appreciated that the sizing corrections of the present invention can be stored in one database, or in a plurality of databases. In step 845, a modified mask is written. In step 850, the process stops.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for manufacturing a mask, comprising:

an edge detector, the edge detector determining one or more edge data of a portion of a mask feature;

a processor, the processor receiving the one or more edge data and operatively coupled to an algorithm for calculating one or more area loss data from the one or more edge data; and a mask writer, the mask writer operatively coupled to the processor to receive the one or more area loss data.

2. The system of claim 1, wherein the mask writer includes an algorithm for determining one or more sizing correction data from the one or more area loss data.

3. The system of claim 2, further comprising a database operatively coupled to the mask writer to store the one or more sizing correction data.

4. The system of claim 1, wherein the edge detector comprises a scanning electron microscope.

5. The system of claim 4, wherein the mask writer includes an algorithm for modifying a mask layout in accordance with the one or more sizing correction data.

6. The system of claim 5, wherein the mask layout is an optical proximity corrected mask layout.

7. The system of claim 1, wherein the portion of the mask feature is an optical proximity correction feature.

8. A mask created by the system of claim 1.

9. A system for manufacturing a mask, comprising:

an edge detector, the edge detector determining one or more edge data;

a processor, the processor receiving the one or more edge data and operatively coupled to the one or more algorithms for determining one or more sizing correction data from the one or more edge data, wherein the one or more algorithms for determining sizing correction data utilize one or more area loss data generated from the one or more edge data; and a mask writer, the mask writer operatively coupled to the processor to receive the one or more sizing correction data.

10. The system of claim 9, wherein the mask writer further includes at least one algorithm for modifying a mask layout in accordance with the one or more sizing correction data.

11. The system of claim 10, wherein the mask layout includes one or more optical proximity correction features.

12. The system of claim 10, wherein the mask layout is an optical proximity corrected mask layout.

13. The system of claim 9, further comprising a database operatively coupled to the mask writer to store the one or more sizing correction data.

14. The system of claim 9, wherein the edge detector is a scanning electron microscope.

15. A mask created by the system of claim 9.

* * * * *

UNITED STATES PATENT AND TRADEMARK OFFICE
CERTIFICATE OF CORRECTION

PATENT NO. : 6,444,373 B1
DATED : September 3, 2002
INVENTOR(S) : Ramkumar Subramanian, Khoi A. Phan, Bhanwar Singh and Bharath Rangarajan It is certified that error appears in the above-identified patent and that said Letters Patent is hereby corrected as shown below:

Column 3,
Line 7, please replace the word "comer" with the word -- corner --.

Column 8,
Line 33, please replace the word "comer" with the word -- corner -- in two places.
Line 46, please replace the word "comer" with the word -- corner --.

Signed and Sealed this

Fifteenth Day of October, 2002

Attest:

Attesting Officer

JAMES E. ROGAN
Director of the United States Patent and Trademark Office